(12) United States Patent
Chiu

(10) Patent No.: US 12,470,182 B2
(45) Date of Patent: Nov. 11, 2025

(54) CLASS D AMPLIFIER DRIVING CIRCUIT

(71) Applicant: REALTEK SEMICONDUCTOR CORPORATION, Hsinchu (TW)

(72) Inventor: Chien-Hao Chiu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 503 days.

(21) Appl. No.: 18/099,000

(22) Filed: Jan. 19, 2023

(65) Prior Publication Data

US 2023/0268892 A1 Aug. 24, 2023

(30) Foreign Application Priority Data

Feb. 18, 2022 (TW) .................................. 111106017

(51) Int. Cl.
H03F 3/217 (2006.01)
G05F 1/46 (2006.01)
H03F 3/185 (2006.01)

(52) U.S. Cl.
CPC ........... H03F 3/2173 (2013.01); G05F 1/468 (2013.01); *H03F 2200/441* (2013.01); *H03F 2200/78* (2013.01)

(58) Field of Classification Search
CPC ............ H03F 3/2173; H03F 2200/441; H03F 2200/78; H03F 1/0227; H03F 3/183; H03F 3/2171; G05F 1/468; G05F 1/56; G05F 1/575
USPC ................. 330/251, 207 A, 10, 297
See application file for complete search history.

(56) References Cited

U.S. PATENT DOCUMENTS

| 10,895,884 | B2* | 1/2021 | Kotrc | ...................... G05F 1/468 |
| 2018/0337637 | A1* | 11/2018 | Galal | .................... H03F 1/0233 |
| 2019/0146530 | A1 | 5/2019 | Kotrc | |

OTHER PUBLICATIONS

2) OA letter of a counterpart TW application (appl. No. 111106017) mailed on 2022/08/11.3) Summary of the TW OA letter in regard to the TW counterpart application:Claim(s) 1 is/are rejected under Patent Law Article 22(2) as allegedly being unpatentable over reference 1 (US 2019/0146530 A1). Claim correspondence between the TW counterpart application and the instant US application:Claims 1-10 in the TW counterpart application correspond to claims 1-6 and 8-11 in the instant US application, respectively.
Texas Instruments "TAS2562 6.1-W Boosted Class-D Audio Amplifier with IV Sense" datasheet p. 23, www.ti.com.

* cited by examiner

Primary Examiner — Hieu P Nguyen
(74) Attorney, Agent, or Firm — WPAT, PC

(57) ABSTRACT

A class D amplifier driving circuit is used to generate an output gate driving voltage according to an input voltage that dynamically varies with the amplitude of an audio signal, and the driving voltage is used to drive the high-voltage transistor of the class D amplifier. The class D amplifier driving circuit includes: a reference voltage generation circuit for generating a second reference voltage according to a first reference voltage; a clamping circuit for clamping the input voltage; a low dropout (LDO) linear regulator pre-stage for generating an intermediate voltage according to the second reference voltage; and an LDO linear regulator output stage for generating the driving voltage according to the input voltage and the intermediate voltage.

11 Claims, 4 Drawing Sheets

CLASS D AMPLIFIER DRIVING CIRCUIT

BACKGROUND OF THE INVENTION

1. Field of the Invention

The present invention generally relates to a power boost circuit and a class D amplifier, and, more particularly, to a driving circuit for processing a high-side high-voltage gate.

2. Description of Related Art

FIG. 1 shows a functional block diagram of a conventional amplifier system. The amplifier system 100 includes a power management circuit 110, a boost circuit 120, a charge pump 130, a class D amplifier 140, and other circuits 150. The power management circuit 110 receives the system voltage VBAT and supplies power to the entire amplifier system 100 according to the system voltage VBAT. The boost circuit 120 receives the system voltage VBAT through the inductor L1 and generates a dynamic boost voltage VBST according to the system voltage VBAT. The boost circuit 120 outputs the dynamic boost voltage VBST through a pin which is coupled to the ground through the capacitor C1 and coupled to the output pin of the charge pump 130 (i.e., the pin that outputs the driving voltage GREG) through the capacitor C2. The charge pump 130 generates the driving voltage GREG according to the dynamic boost voltage VBST. The driving voltage GREG is used to drive the high-side bridge transistor (not shown) of the boost circuit 120 and the high-side bridge transistor (not shown) of the class D amplifier 140. The voltage difference between the driving voltage GREG and the dynamic boost voltage VBST is less than 5 volts. The class D amplifier 140, which is driven by the driving voltage GREG, amplifies the audio signal SA generated by other circuits 150 to generate the audio output OUT. The audio output OUT is played through the speaker 101.

However, because the charge pump 130 needs to switch between different clock phase (which inevitably causes a switching loss current), and the static power consumption of the charge pump 130 is huge, the charge pump 130 lowers the energy efficiency of the amplifier system 100 for very small signal audio sources.

SUMMARY OF THE INVENTION

In view of the issues of the prior art, an object of the present invention is to provide a class D amplifier driving circuit, so as to make an improvement to the prior art.

One embodiment of the present invention provides a boost circuit and a class D amplifier gate driving circuit used for generating an adaptive driving voltage according to an input voltage that increases dynamically. The driving voltage is used to drive a boost circuit and a class D amplifier. The class D amplifier driving circuit includes a reference voltage generation circuit, a clamping circuit, a low dropout (LDO) linear regulator pre-stage, and an LDO linear regulator output stage. The reference voltage generation circuit is configured to generate, according to a first reference voltage, a second reference voltage. The clamping circuit is configured to clamp the input voltage. The LDO linear regulator pre-stage is coupled to the reference voltage generation circuit and the clamping circuit and configured to generate an intermediate voltage according to the second reference voltage. The LDO linear regulator output stage is coupled to the LDO linear regulator pre-stage and configured to generate the driving voltage according to the input voltage and the intermediate voltage.

The class D amplifier driving circuit of the present invention can dynamically save current. In comparison with the prior art, the class D amplifier driving circuit and the amplifier system of the present invention are more competitive due to their power-saving capabilities.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a class D amplifier driving circuit. On account of that some or all elements of the class D amplifier driving circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
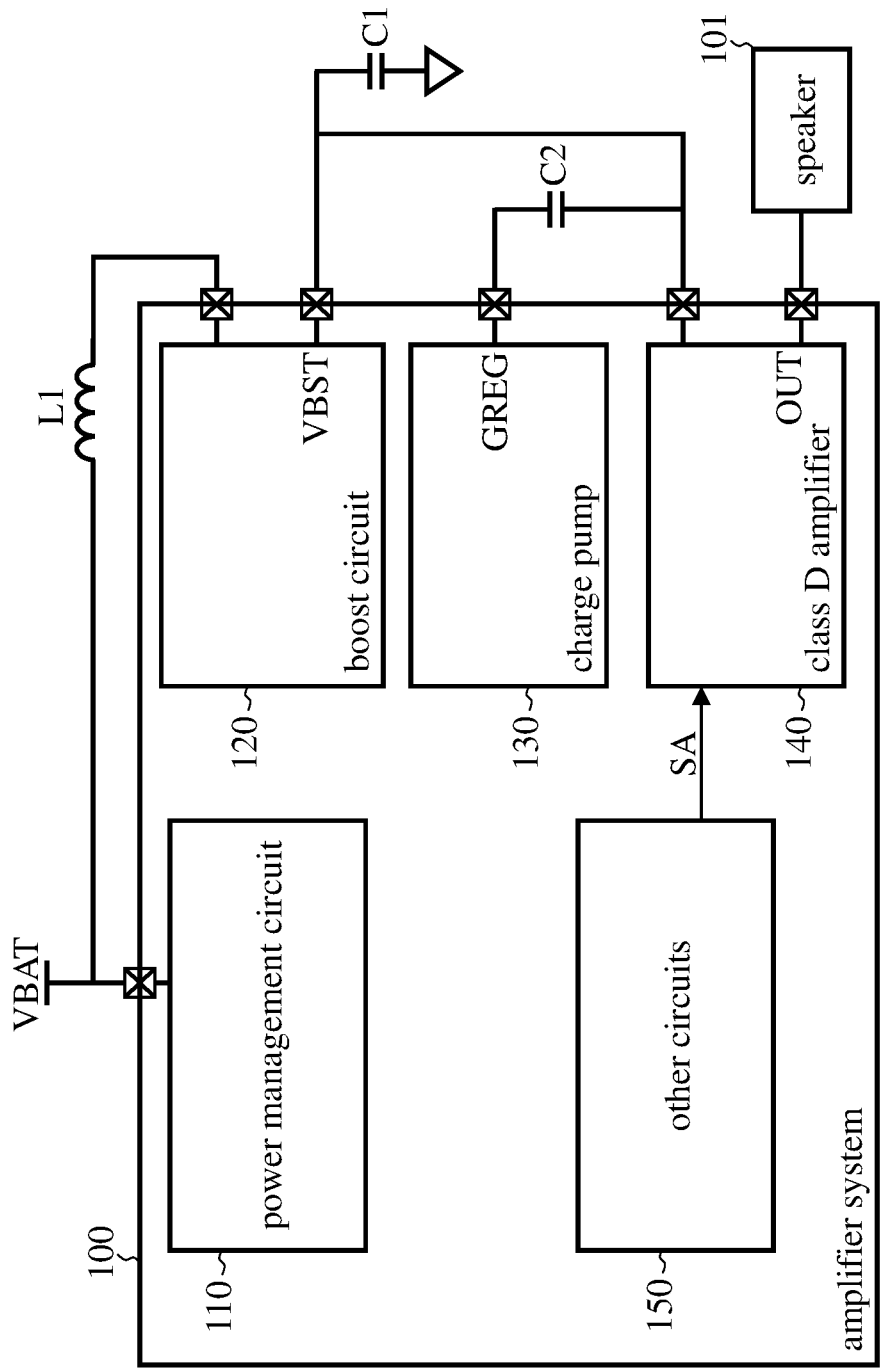
FIG. 1 shows a functional block diagram of a conventional amplifier system.
Figure 2:
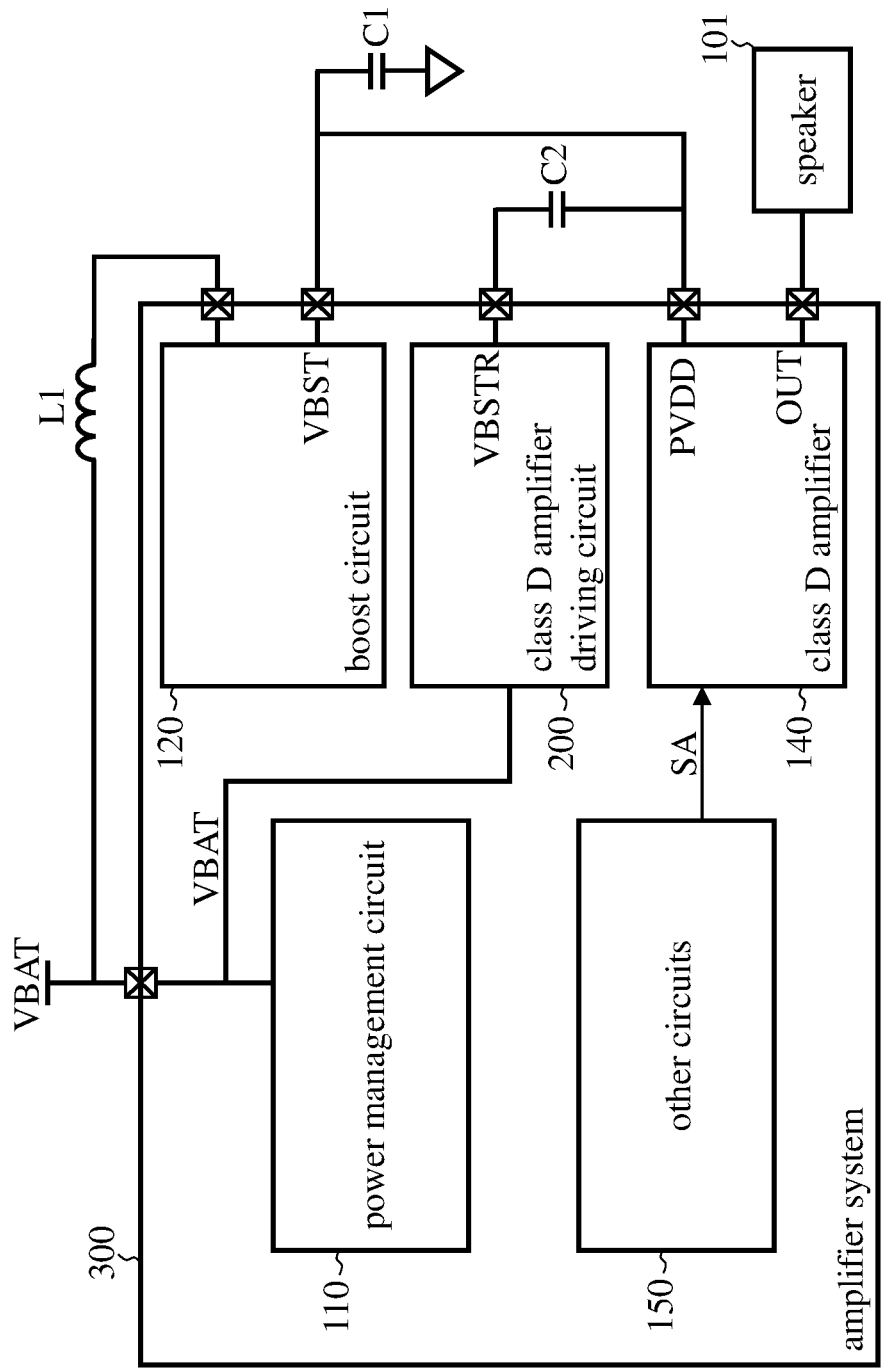
FIG. 2 is a functional block diagram of an amplifier system according to an embodiment of the present invention.

FIG. 2 is a functional block diagram of an amplifier system according to an embodiment of the present invention. The amplifier system 300 includes a power management circuit 110, a boost circuit 120, a class D amplifier 140, other circuits 150, and a class D amplifier driving circuit 200. The power management circuit 110, the boost circuit 120, the class D amplifier 140, and other circuits 150 of FIG. 2 are respectively the same as or similar to the power management circuit 110, the boost circuit 120, the class D amplifier 140, and other circuits 150 of FIG. 1 in terms of functions, and the details are omitted for brevity. The class D amplifier driving circuit 200 is coupled to the boost circuit 120 and the class D amplifier 140, and configured to generate the gate driving voltage VBSTR according to the dynamic boost voltage VBST and perform power saving control by referring to the system voltage VBAT. In other words, the dynamic boost voltage VBST can be regarded as the input voltage of the class D amplifier driving circuit 200. The circuit of the class D amplifier driving circuit 200 is discussed in detail below in connection with FIG. 3. The voltage PVDD (i.e., the output voltage generated by the boost circuit 120) is the input voltage of the class D amplifier 140.

Figure 3:
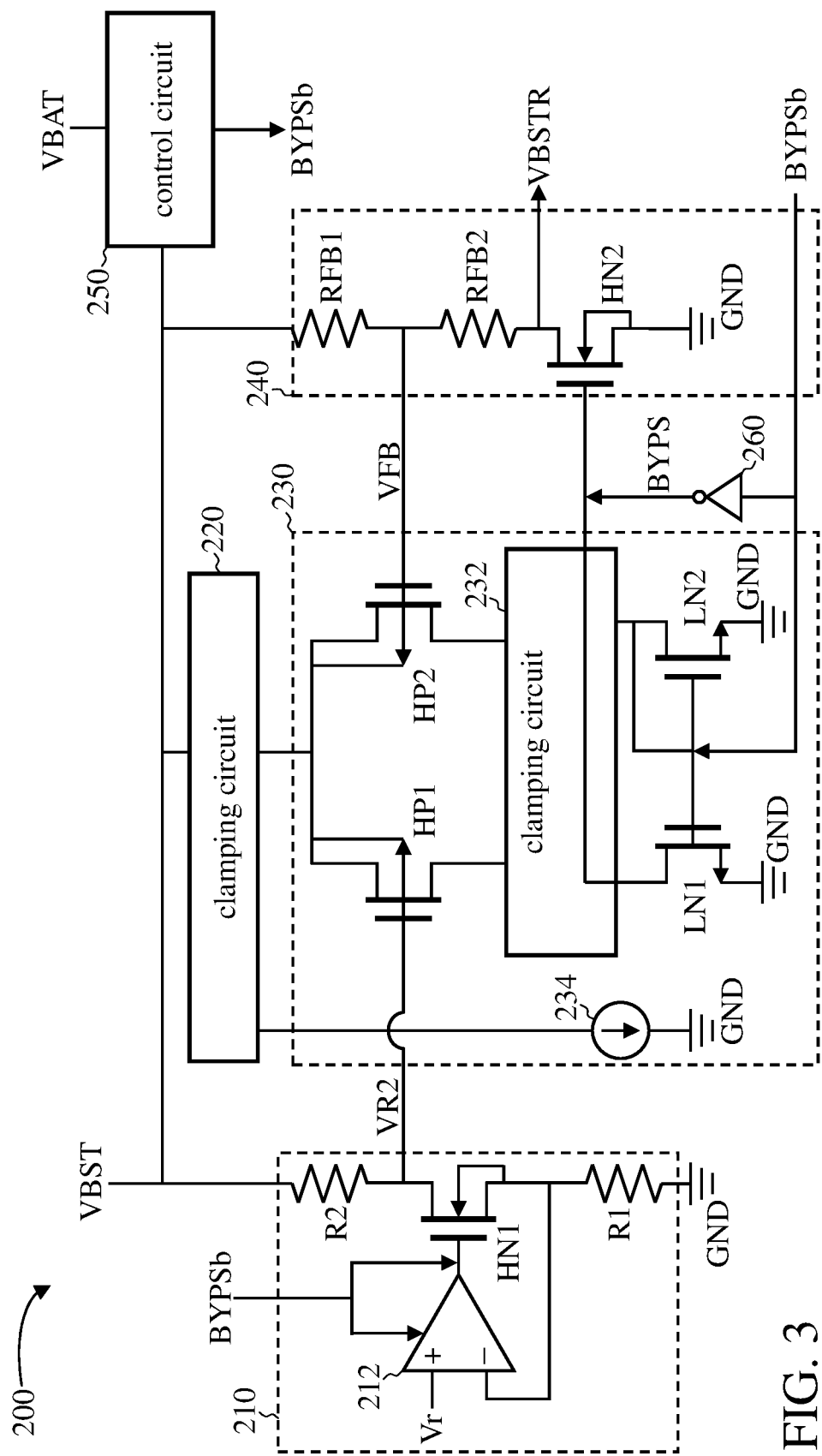
FIG. 3 is a circuit diagram of a class D amplifier driving circuit according to an embodiment of the present invention.

FIG. 3 is a circuit diagram of the class D amplifier driving circuit 200 according to an embodiment. The class D amplifier driving circuit 200 includes a reference voltage generation circuit 210, a clamping circuit 220, a low dropout (LDO) linear regulator pre-stage 230, an LDO linear regulator output stage 240, and a control circuit 250.

The reference voltage generation circuit 210 includes an error amplifier (EA) 212, a transistor HN1, a resistor R1, and a resistor R2. One input terminal of the EA 212 receives the reference voltage Vr, the other input terminal of the EA 212 is coupled or electrically connected to the source of the transistor HN1, and the output terminal of the EA 212 is coupled or electrically connected to the gate of the transistor HN1. One end of the resistor R2 receives the dynamic boost voltage VBST, and the other end of the resistor R2 is coupled or electrically connected to the drain of the transistor HN1. One end of the resistor R1 is coupled or electrically connected to the source of the transistor HN1, and the other end of the resistor R1 is coupled or electrically connected to the ground level GND. The reference voltage generation circuit 210 outputs a reference voltage VR2 (as shown in equation (1)). The operational details of the reference voltage generation circuit 210 are well known to people having ordinary skill in the art and thus omitted for brevity.

$$VR2 = VBST - R2 \times (Vr/R1) \quad (1)$$

In some embodiments, because the reference voltage Vr is a precise (i.e., small variation) bandgap voltage, and the reference voltage generation circuit 210 does not use a current mirror to generate the reference voltage VR2 (therefore, the variation in the difference between the reference voltage VR2 and the dynamic boost voltage VBST is small), the risk of the difference between the voltage VBSTR of the LDO linear regulator output stage 240 and the dynamic boost voltage VBST being overly high is very low.

The clamping circuit 220 receives the dynamic boost voltage VBST and protects the components that have a low withstand voltage in the LDO linear regulator pre-stage 230 (including but not limited to the current source 234, the transistor LN1, and the transistor LN2) from being damaged by high voltages.

The LDO linear regulator pre-stage 230 includes a clamping circuit 232, a current source 234, and four transistors (HP1, HP2, LN1, and LN2). The purpose of the current source 234 is to provide a reference current which is used, for example, to bias the transistor HP1 and the transistor HP2. The gate of the transistor HP1 is coupled or electrically connected to the drain of the transistor HN1 (i.e., the gate of the transistor HP1 receives the reference voltage VR2), the source of the transistor HP1 is coupled or electrically connected to the clamping circuit 220, and the drain of the transistor HP1 is coupled or electrically connected to the clamping circuit 232. The gate of the transistor HP2 outputs the intermediate voltage VFB, the source of the transistor HP2 is coupled or electrically connected to the clamping circuit 220, and the drain of the transistor HP2 is coupled or electrically connected to the clamping circuit 232.

The clamping circuit 232 is used to protect the transistor LN1 and the transistor LN2 from being damaged by high voltages. The gate of the transistor LN1 is coupled or electrically connected to the gate of the transistor LN2, the source of the transistor LN1 is coupled or electrically connected to the ground level GND, and the drain of the transistor LN1 is coupled or electrically connected to the clamping circuit 232. The gate of the transistor LN2 is coupled or electrically connected to the gate of the transistor LN1, the source of the transistor LN2 is coupled or electrically connected to the ground level GND, and the drain of the transistor LN2 is coupled or electrically connected to the clamping circuit 232 and the gate of the transistor LN2.

The LDO linear regulator output stage 240 includes a transistor HN2, a resistor RFB1, and a resistor RFB2. The resistor RFB1, the resistor RFB2, and the transistor HN2 are connected in series between the dynamic boost voltage VBST and the ground level GND. More specifically, one end of the resistor RFB1 is coupled or electrically connected to the dynamic boost voltage VBST (i.e., receives the dynamic boost voltage VBST), and the other end of the resistor RFB1 is coupled or electrically connected to the gate of the transistor HP2 and one end of the resistor RFB2. One end of the resistor RFB2 is coupled or electrically connected to the gate of the transistor HP2, and the other end of the resistor RFB2 is coupled or electrically connected to the drain of the transistor HN2. The gate of the transistor HN2 is coupled or electrically connected to the drain of the transistor LN1, the drain of the transistor HN2 outputs the driving voltage VBSTR, and the source of the transistor HN2 is coupled or electrically connected to the ground level GND.

The direct current (DC) voltage of the gate of the transistor HN2 and the DC voltage of the drain of the transistor LN1 are clamped by the clamping circuit 232, and the alternating current (AC) signal transmitted between the transistor HN2 and the transistor LN1 is not affected by the clamping circuit 232. The operational details of the transistors in the LDO linear regulator pre-stage 230 and the LDO linear regulator output stage 240 are well known to people having ordinary skill in the art and thus omitted for brevity.

The intermediate voltage VFB is substantially equal to the reference voltage VR2. In some embodiments, when the resistance value of the resistor RFB1 is equal to the resistance value of the resistor RFB2, the driving voltage VBSTR is as shown in equation (2).

$$VBSTR = VBST - 2 \times (Vr/R1) \times R2 \quad (2)$$

As shown in equation (2), the difference between the driving voltage VBSTR and the dynamic boost voltage VBST ($|2\times(Vr/R1)\times R2|$) is substantially constant, that is, the driving voltage VBSTR can quickly track the dynamic boost voltage VBST in high power consumption mode, achieving the effect of driving the boost circuit 120 and the high-side P-channel metal-oxide-semiconductor field-effect transistor (PMOS transistor) of the class D amplifier 140 without over-voltage risk.

The control circuit 250 is coupled or electrically connected to the reference voltage generation circuit 210, the LDO linear regulator pre-stage 230, and the LDO linear regulator output stage 240 through the control signal BYPSb. The control circuit 250 generates the control signal BYPSb according to the system voltage VBAT and the dynamic boost voltage VBST. To some extent, the dynamic boost voltage VBST reflects the power requirement of the class D amplifier 140 for playing the audio source; more specifically, the dynamic boost voltage VBST is approximately or substantially proportional to the power requirement of the class D amplifier 140 for playing the audio source. When the power requirement of the class D amplifier 140 for playing the audio source is small, the control circuit 250 generates, by detecting the magnitude relationship between the dynamic boost voltage VBST and the system voltage VBAT (e.g., by comparing these two voltages), the control signal BYPSb to turn off the reference voltage generation circuit 210 and the LDO linear regulator pre-stage 230, so as to ensure that the transistor HN2 is not fully turned on unless the voltage difference VBST−VBSTR is within the safe range of the operation voltage. As a result, the overall class D amplifier driving circuit 200 can reduce power consumption. More specifically, when the system enters a low power consumption mode (also referred to as a bypass mode, that is, when the power requirement of the class D amplifier 140 for playing the audio source is small (i.e., when the signal audio source is extremely small)), the control circuit 250 turns off the EA 212, the transistor HN1, the transistor LN1, and the transistor LN2 (i.e., controls the gate voltages of the transistor HN1, the transistor LN1, and the transistor LN2 to be 0 V) by controlling the control signal BYPSb to be a low level (e.g., 0 V); in this instance, the control signal BYPS outputted by the inverter 260 (which is coupled or electrically connected between the control circuit 250 and the gate of the transistor HN2) is at a high level (e.g., 5 V), rendering the transistor HN2 to be completely turned on. In other words, in the low power consumption mode, the reference voltage generation circuit 210 and the LDO linear regulator pre-stage 230 are turned off (no power consumption), and only the LDO linear regulator output stage 240 in the class D amplifier driving circuit 200 consumes very little current, thus achieving the purpose of increasing the overall efficiency when the system is playing a small signal audio source.

In some embodiments, in the low power consumption mode (i.e., when the transistor HN2 is turned on), the driving voltage VBSTR is substantially 0 V, and the dynamic boost voltage VBST is approximately or equal to the system voltage VBAT; that is, the voltage difference between the dynamic boost voltage VBST and the driving voltage VBSTR is approximately the system voltage VBAT. In other words, in the low power consumption mode, the class D amplifier driving circuit 200 keeps the voltage difference between the dynamic boost voltage VBST and the driving voltage VBSTR to be substantially equal to the system voltage VBAT, ensuring that the boost circuit 120 and the high-side PMOS of the class D amplifier 140 can work normally in the subsequent operations without the risk of overvoltage.

Figure 4:
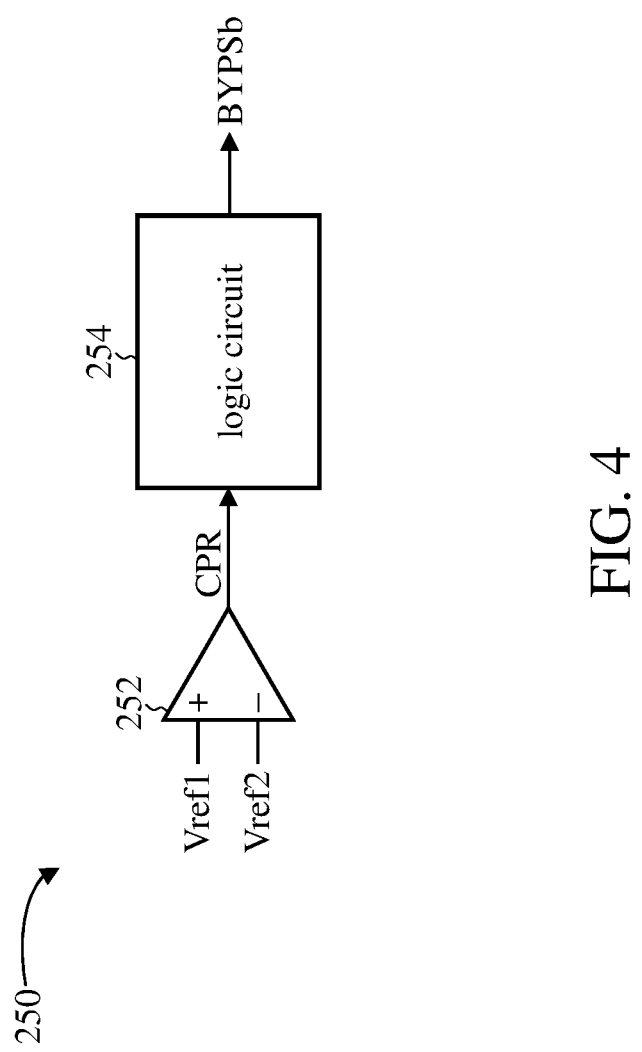
FIG. 4 is a functional block diagram of a control circuit according to an embodiment of the present invention.

In some embodiments, to prevent the control circuit 250 from controlling the class D amplifier driving circuit 200 to directly enter the bypass low power consumption mode (which may later cause damages to the circuit elements due to overly high voltages) when the dynamic boost voltage VBST is relatively high, the control circuit 250 can detect the instantaneous change of the dynamic boost voltage VBST (i.e., generating the control signal BYPSb according to the magnitude relationship between the dynamic boost voltage VBST and the system voltage VBAT (e.g., according to whether the dynamic boost voltage VBST is greater or smaller than the system voltage VBAT)). FIG. 4 is a functional block diagram of the control circuit 250 according to an embodiment. The control circuit 250 includes a comparator 252 and a logic circuit 254. The comparator 252 compares the voltage Vref1 and the voltage Vref2 to generate the comparison result CPR, and the logic circuit 254 generates the control signal BYPSb according to the comparison result CPR.

In some embodiments, the voltage Vref1 may be the system voltage VBAT or a voltage derived from the system voltage VBAT (e.g., a divided voltage), while the voltage Vref2 may be the dynamic boost voltage VBST or a voltage derived from the dynamic boost voltage VBST. Therefore, when the control circuit 250 detects that the dynamic boost voltage VBST is relatively low (e.g., when the voltage Vref2 is lower than the voltage Vref1, or the dynamic boost voltage VBST is substantially lower than the system voltage VBAT), the logic circuit 254 outputs a low-level control signal BYPSb in response to the high-level comparison result CPR. People having ordinary skill in the art may flexibly design the logic circuit 254. For example, in other embodiments, the logic circuit 254 outputs a high-level control signal in response to the high-level comparison result CPR to directly control the gate of the transistor HN2 so as to fully turn on the transistor HN2, and uses the inverse of the control signal to turn off the reference voltage generation circuit 210 and the LDO linear regulator pre-stage 230. In addition, in some embodiments, people having ordinary skill in the art can apply the concept of hysteresis to the comparator 252 to prevent the logic circuit 254 from repeatedly switching the level of the control signal BYPSb in a short period of time.

To sum up, the class D amplifier driving circuit 200 of the present invention has no switching loss current and consumes very little power in the low power consumption mode (because most of the circuits are turned off) by instantly detect VBST−VBSTR voltage difference. Furthermore, the class D amplifier driving circuit 200 of the present invention is smaller in area than the charge pump because the class D amplifier driving circuit 200 needs only one power element (i.e., the transistor HN2). Therefore, the amplifier system 300 of the present invention is more competitive than the conventional amplifier system 100.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A class D amplifier driving circuit that generates a driving voltage according to an input voltage, the driving voltage being used to drive a class D amplifier, the class D amplifier driving circuit comprising:
   a reference voltage generation circuit configured to generate, according to a first reference voltage, a second reference voltage;
   a clamping circuit configured to clamp the input voltage;
   a low dropout (LDO) linear regulator pre-stage coupled to the reference voltage generation circuit and the clamping circuit and configured to generate an intermediate voltage according to the second reference voltage; and
   an LDO linear regulator output stage coupled to the LDO linear regulator pre-stage and configured to generate the driving voltage according to the input voltage and the intermediate voltage.

2. The class D amplifier driving circuit of claim 1 further comprising:
   a control circuit configured to generate a control signal according to the input voltage and a system voltage, the control signal being used to control the reference voltage generation circuit, the LDO linear regulator pre-stage, and the LDO linear regulator output stage.

3. The class D amplifier driving circuit of claim 2, wherein when the input voltage is substantially lower than the system voltage, the control circuit turns off the reference voltage generation circuit and the LDO linear regulator pre-stage through the control signal.

4. The class D amplifier driving circuit of claim 3, wherein the LDO linear regulator output stage comprises a first resistor, a second resistor, and a transistor connected in series, the intermediate voltage is outputted to a node between the first resistor and the second resistor, and when the input voltage is substantially lower than the system voltage, the control circuit turns on the transistor.

5. The class D amplifier driving circuit of claim 4, wherein when the transistor is turned off, the driving voltage is substantially zero volts.

6. The class D amplifier driving circuit of claim 2, wherein the reference voltage generation circuit comprises:
- an error amplifier (EA) configured to receive the first reference voltage;
- a transistor having a gate, a source, and a drain, wherein the gate is coupled to an output terminal of the EA;
- a first resistor coupled between the source of the transistor and a ground level; and
- a second resistor, wherein an end of the second resistor is coupled to the drain of the transistor, and an other end of the second resistor receives the input voltage;
- wherein the drain of the transistor outputs the second reference voltage.

7. The class D amplifier driving circuit of claim 6, wherein when the input voltage is substantially lower than the system voltage, the control circuit turns off the EA and the transistor through the control signal.

8. The class D amplifier driving circuit of claim 2, wherein the clamping circuit is a first clamping circuit, the LDO linear regulator pre-stage comprising:
- a second clamping circuit;
- a current source coupled between the first clamping circuit and a ground level;
- a first transistor coupled between the first clamping circuit and the second clamping circuit, wherein a gate of the first transistor receives the second reference voltage;
- a second transistor coupled between the first clamping circuit and the second clamping circuit, wherein a gate of the second transistor outputs the intermediate voltage;
- a third transistor coupled between the second clamping circuit and the ground level; and
- a fourth transistor coupled between the second clamping circuit and the ground level;
- wherein a gate of the third transistor is coupled to a gate of the fourth transistor, and a drain of the fourth transistor is coupled to the gate of the fourth transistor.

9. The class D amplifier driving circuit of claim 8, wherein when the input voltage is substantially lower than the system voltage, the control circuit turns off the third transistor and the fourth transistor through the control signal.

10. The class D amplifier driving circuit of claim 8, wherein the LDO linear regulator output stage comprises:
- a fifth transistor having a gate, a source, and a drain, wherein the gate of the fifth transistor is coupled to a drain of the third transistor, and the source of the fifth transistor is coupled to the ground level;
- a first resistor having a first end and a second end, wherein the first end receives the input voltage; and
- a second resistor having a third end and a fourth end, wherein the third end is coupled to the second end, and the fourth end is coupled to the drain of the fifth transistor;
- wherein the second end of the first resistor and the third end of the second resistor receive the intermediate voltage, and the drain of the fifth transistor outputs the driving voltage.

11. The class D amplifier driving circuit of claim 2, wherein the control circuit comprises:
- a comparator configured to generate a comparison result by comparing a first voltage and a second voltage; and
- a logic circuit coupled to the comparator and configured to generate the control signal according to the comparison result.

* * * * *